United States Patent [19]
Lin

[11] Patent Number: 5,763,294
[45] Date of Patent: Jun. 9, 1998

[54] SOLID TAPE AUTOMATED BONDING PACKAGING METHOD

[75] Inventor: Ting-Hao Lin, Taoyuan Hsien, Taiwan

[73] Assignee: Compeq Manufacturing Company Limited, Taiwan

[21] Appl. No.: 856,966

[22] Filed: May 15, 1997

[51] Int. Cl.⁶ .................................................. H01L 21/60
[52] U.S. Cl. ................................. 438/111; 438/123
[58] Field of Search .......................... 438/110, 111, 438/112, 121, 123

[56] References Cited

U.S. PATENT DOCUMENTS

| | | | |
|---|---|---|---|
| 4,411,719 | 10/1983 | Lindberg | 438/111 |
| 5,212,402 | 5/1993 | Higgins, III | 438/123 |
| 5,474,957 | 12/1995 | Urushima | 438/123 |
| 5,518,957 | 5/1996 | Kim | 438/123 |
| 5,556,907 | 9/1996 | Bhattacharyya et al. | 438/123 |
| 5,661,086 | 8/1997 | Nakashima et al. | 438/111 |

*Primary Examiner*—Kevin Picardat
*Attorney, Agent, or Firm*—Hedman, Gibson & Costigan, P.C.

[57] ABSTRACT

A solid tape automated bonding method includes steps of: applying a pattern of a first dry film on a first portion of a copper plate; forming wiring; forming bumps; removing dry film and exposing the wiring and the bumps; selectively laminating an insulator layer onto portions of the exposed copper plate and the wiring; laminating a metal layer on the insulator layer; applying glue on the metal layer, the bumps, and respective exposed portions of the wiring and the copper plate; etching the copper plate thus exposing one side of the wiring as ball pads and exposing one side of the insulator layer; coating solder resist on the exposed bottom side of the insulator layer; removing the glue; attaching a die against the bumps; applying mold compound onto the die so as to fix the die in place; and attaching solder balls onto the ball pads. This method provides relatively high density of wiring and simplification in manufacturing.

7 Claims, 7 Drawing Sheets

SOLID TAPE AUTOMATED BONDING PACKAGING METHOD

BACKGROUND OF THE INVENTION

1. Field of the Invention

The present invention relates to a packaging method, particularly one which is used to package a semiconductor device such as a memory chip or a central processing chip in a solid tape automated bonding manner so as to reduce the complexity of packaging work and promote the operation efficiency of the packaging work.

2. Description of the Prior Art

Packaging work of semiconductor chips has progressed from an SMT (surface mounting technology) method to a TAB (tape automated bonding) method since the latter has a smaller pitch (for example 0.25 to 0.3 mm) between two adjacent leads than that of the former. However, the TAB method for packaging used at the present time is complicated, time consuming, and results in a low yield, therefore an improved method is earnestly required by the industry. FIGS. 2A to 2J illustrate the schematic procedure of the TAB method used at the present time.

Initially referring to FIG. 2A, a first step of the TAB packaging method is to form a single layer of dry film pattern 72 on a foil plane 71 deposited on a soft plate 70 which defines a hole 700 substantially at the center thereof. A second step as shown in FIG. 2B is to insert glue 73 to fill the hole 700 in the soft plate 70, and also etch a portion of the foil plane 71 which is not covered by the dry film pattern 72 thus obtaining conductive wiring of foil 71 which has a pattern identical to the pattern of the dry film 72. Referring to FIG. 2C, a third step is executed to remove the dry film 72 which covers the foil pattern 71. A fourth step as shown in FIG. 2D is to laminate a film of polyimide on the surface of the product formed in FIG. 2C so as to cover the foil pattern 71. A fifth step as shown in FIG. 2E is to laminate a pattern of etching resist 75 on the surface of the product formed in FIG. 2D, therefore a portion of the polyimide film 74 is protected by the etching resist pattern while other portions which are not covered by the etching resist pattern are exposed. A sixth step as shown in FIG. 2F is to etch the exposed portion of the polyimide film 74 thus forming via to contact the foil 71. A seventh step as shown in FIG. 2G is to remove the etching resist 75, remove the glue 73, and execute a sputtering procedure on the lower bottom surface of the product of FIG. 2F so as to form bumps 77 on the lower bottom surface of the foil 71 as soldering points. An eighth step as shown in FIG. 2H is to apply a reinforcing layer 76 for example, a solid layer, on the lower bottom surface of the soft plate 70. A ninth step as shown in FIG. 2I is to attach a die 80 in the structure so that the bumps 77 are in contact with the die 80 and further apply mold compound 90 attached to the die 80 in order to fix the die 80 in position. A tenth step as shown in FIG. 2J is to attach solder balls on the foil portions 71 which are exposed under the polyimide pattern 74.

However the above conventional method has the following drawbacks:

(1) complicated procedure causing low yield: The steps as mentioned in FIGS. 2A to 2G merely utilize a single soft plate 70 as the substrate plate causing difficulties in operation. Moreover, the complexity of the whole manufacturing procedure causes low yield in production.

(2) slow in manufacturing and low efficiency: The bumps 77 of FIG. 2H are formed by a sputtering procedure which slows down the manufacturing speed thus causing low efficiency. Additionally, the purchase of the sputtering machine results in extra high cost.

(3) The requirement of a reinforcing layer results in extra complexity.

(4) The introduce of the reinforcing layer results in extra distance to the die thus the packaging electricity is reduced.

(5) inability to form fine wiring effect: This conventional method merely utilizes dry film etching to etch the foil causing inability in manufacturing relatively fine wiring thus the packaging density is limited.

It is requisite to provide a new method to obviate the above-mentioned drawbacks which occur in the conventional TAB packaging method.

SUMMARY OF THE INVENTION

The primary objective of the present invention is to provide a new solid tape automated bonding method which can provide a semiconductor product with finer wiring (higher wiring density), more convenient procedure, better signal-isolation effect, and better electrical property.

In accordance with one aspect of this invention, there is provided a solid tape automated bonding method comprising steps of: applying a pattern of a first dry film on a first portion of a copper plate, thereafter, depositing a pattern of metal layer on a second portion of the copper plate as wiring; applying a second dry film on the first dry film and the deposited metal layer and selectively defining bond pad areas in the second dry film in order to expose portions of the first deposited metal layer; depositing bondable metal onto the exposed portions of the deposited metal layer as bumps; removing the first dry film and the second dry film thus exposing the wiring and the bumps; selectively laminating an insulator layer onto portions of the exposed copper plate and the wiring; laminating a metal layer on the insulator layer; applying glue on the metal layer, the bumps, and respective exposed portions of the wiring and the copper plate; etching the copper plate thus exposing one side of the wiring as ball pads and exposing one side of the insulator layer; coating solder resist on bottom side of the insulator layer; removing the glue; attaching a die against the bumps; applying mold compound onto the die so as to fix the die in place; and attaching solder balls onto the ball pads.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

A packaging method in accordance with the present invention is disclosed in conjunction with FIGS. 1A to 1I. Initially referring to FIG. 1A, a step for forming a single layer of wiring by deposition of nickel and copper is disclosed, where a pattern of dry film 11 is applied and covered on a first of two portions of a copper plate 10, thereafter, a pattern of nickel layer and copper layer 12 is deposited on the open area of the copper plate 10 which is not covered by the dry film pattern 11. The deposition layer 12 (i.e., the deposited nickel layer and copper layer) constitute the wiring portion of a semiconductor packaging substrate.

Figure 1A:
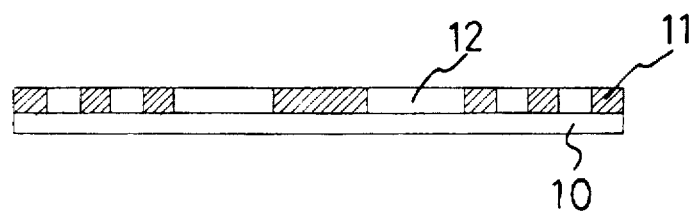
FIG. 1A illustrates a step for forming a single layer of wiring by deposition of nickel and copper in accordance with the present invention.
Figure 1B:
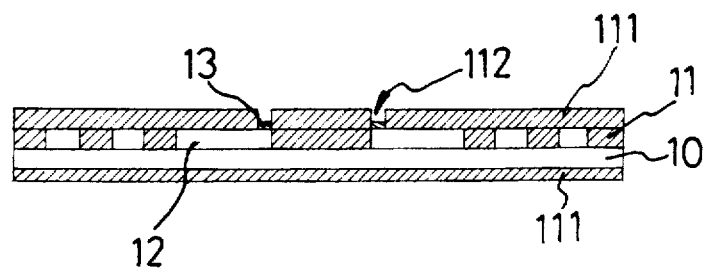
FIG. 1B illustrates a step for selectively depositing nickel layer and gold layer as bumps in accordance with the present invention.

Referring to FIG. 1B, a step for selectively depositing a nickel layer and a gold layer in order to form bumps is disclosed, where two dry films 111 are respectively laminated to two opposite surfaces of the product formed in the previous step. Bumps 112 are defined in the upper dry film 111 and deposition bumps 13 are respectively formed in the bump areas 112. More specifically, the deposition bumps 13 are formed by depositing a nickel layer and a gold layer into the bump areas 112 of the upper dry layer 111.

Figure 1C:
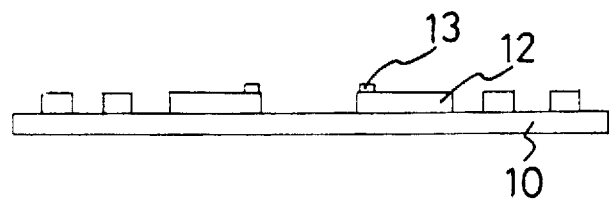
FIG. 1C illustrates a step for removing a dry film in accordance with the present invention.

Referring to FIG. 1C, a step for removing dry films is disclosed, where the dry film 11 and the upper and lower dry films 111 are respectively removed while the copper plate 10, the deposition layer 12 (i.e., the wiring portion of the semiconductor product), and the bumps 13 are retained.

Figure 1D:
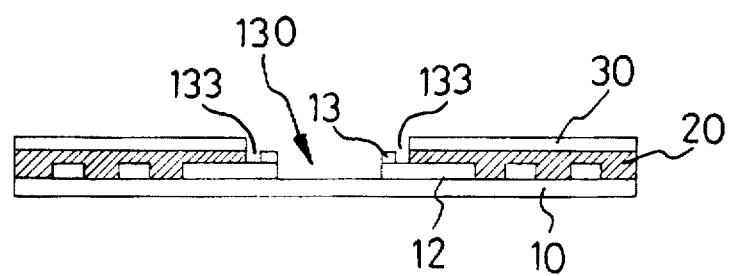
FIG. 1D illustrates a step for laminating an insulator layer and a thin metal layer in accordance with the present invention.

Referring to FIG. 1D, a step for laminating an insulator layer and a thin metal layer is disclosed, where a central portion between two adjacent bumps 13 are maintained while two side portions near the bumps 13 are laminated with an insulator layer 20, for example, by resin material, and a thin metal plate 30 with thickness of 0.5 mm, thereby providing a predetermined support to the product. Two gap portions 133 are defined between the bumps 13 and the laminated layers 20 and 30. A cavity portion 130 substantially at a central portion of the copper plate 10 is defined between the two bumps 13.

Figure 1E:
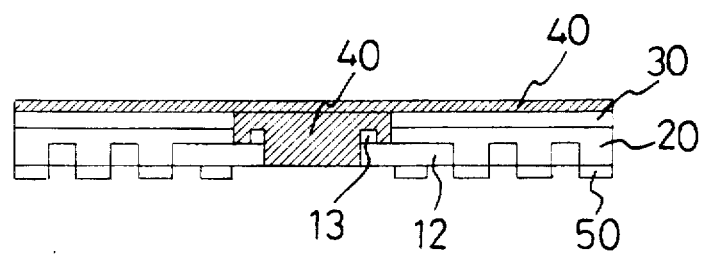
FIG. 1E illustrates a step for applying glue, laminating a film, etching copper foil, and applying solder resist in accordance with the present invention.

Referring to FIG. 1E, a step for applying glue, laminating a film, etching the copper plate, and applying solder resist is disclosed, where glue 40 is applied to the central cavity portion 130 between the two bumps 13, the gap portions 133 between the bumps 13 and the laminated layers 20 and 30, and the upper surface of the product in order to protect the bumps 13 from being damaged; the copper plate 10 at the bottom of the product is etched away; a pattern of solder resist 50 including a plurality of solder resist regions 50 formed by developer is on the bottom of the product.

Figure 1F:
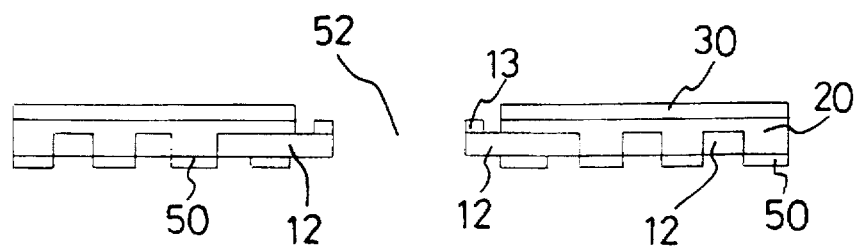
FIG. 1F illustrates a step for removing film and glue used in a previous step in accordance with the present invention.

Referring to FIG. 1F, a step for removing glue applied in the previous step is disclosed, where glue 40 is removed whereby a central space portion 52 is defined.

Figure 1G:
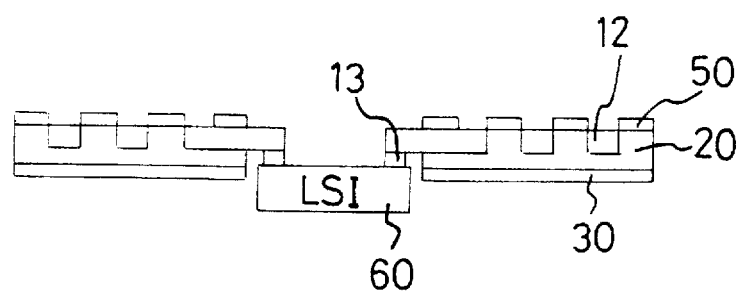
FIG. 1G illustrates a step for attaching the die in a specific position of the product formed in the previous step in accordance with the present invention.

Referring to FIG. 1G, a step for attaching a die in the product is disclosed, where a die 60 is installed under and in contact with two adjacent bumps 13.

Figure 1H:
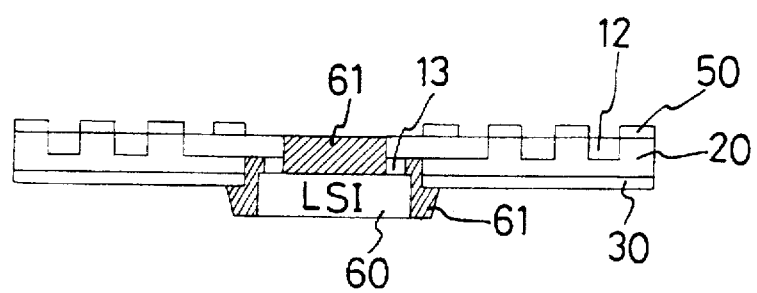
FIG. 1H illustrates a step for applying mold compound on the product formed in the previous step in accordance with the present invention.

Referring to FIG. 1H, a step for applying mold compound on the product applied in the previous step is disclosed, where mold compound 61 is applied above and beside the die 60 so as to protect and retain the die in place.

Figure 1I:
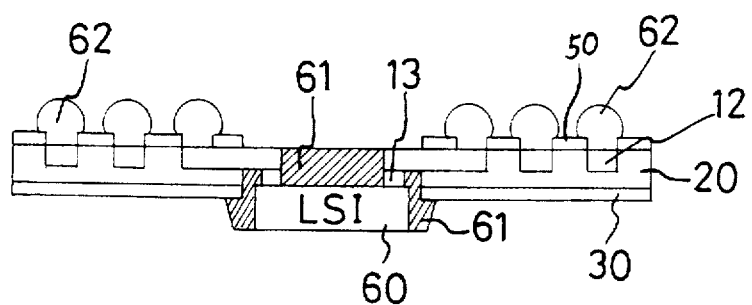
FIG. 1I illustrates a step for attaching solder balls into the product formed in the previous step in accordance with the present invention.

Referring to FIG. 1I, a step for attaching solder balls into the product disposed in the previous step is disclosed, where tin balls 62 are attached between every two adjacent solder resist regions 50.

The step as shown in FIG. 1A for forming a single layer of wiring by a deposition procedure other than by a conventional etching procedure can obtain higher density of wiring than the conventional one.

The step as shown in FIG. 1B for selectively depositing nickel layer and gold layer to form bumps is more convenient and much quicker than what the conventional sputtering procedure can achieve.

Figure 2A:
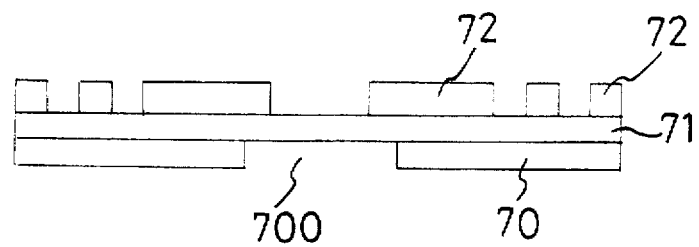
FIGS. 2A to 2J illustrate steps of a conventional TAB packaging method.
Figure 2B:
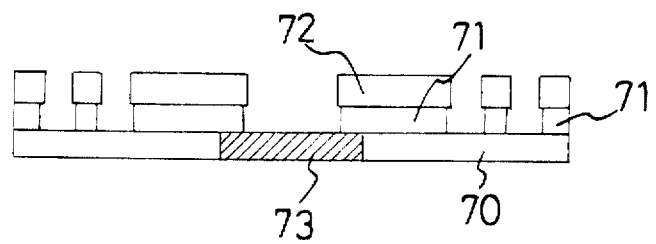
Figure 2C:
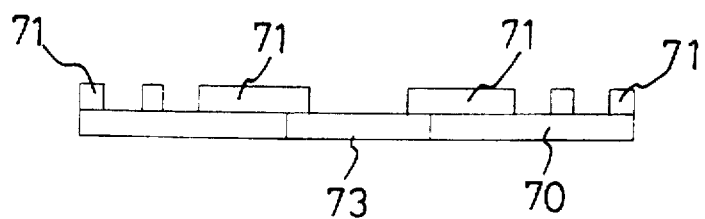
Figure 2D:
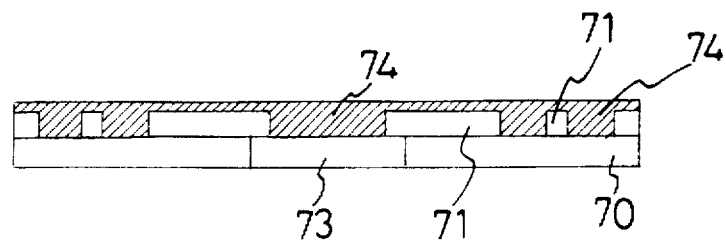
Figure 2E:
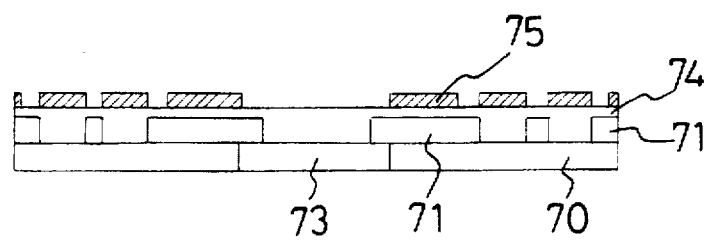
Figure 2F:
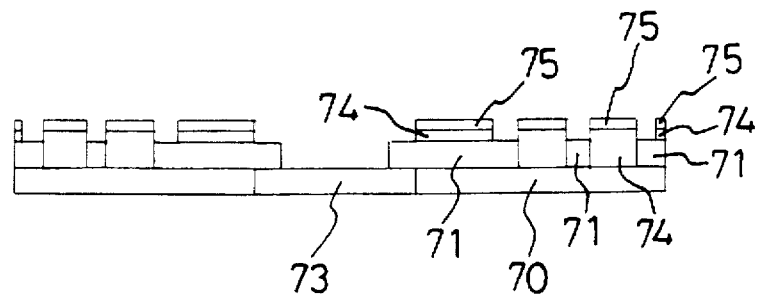
Figure 2G:
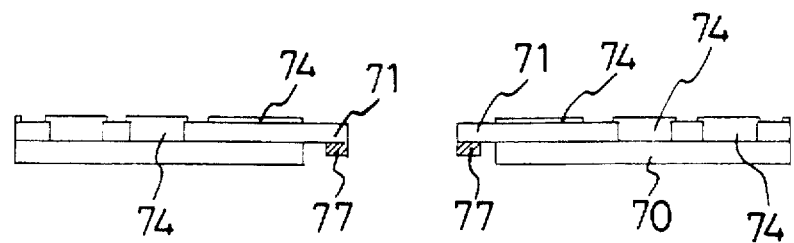
Figure 2H:
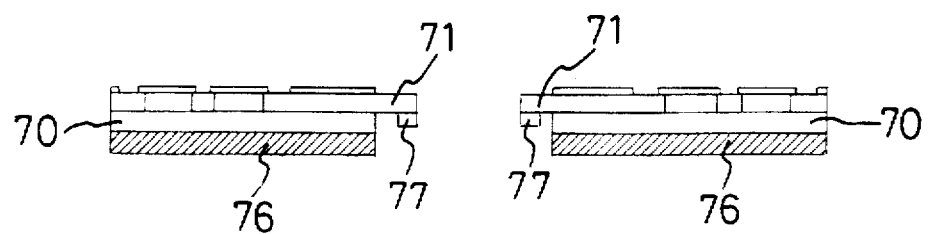
Figure 2I:
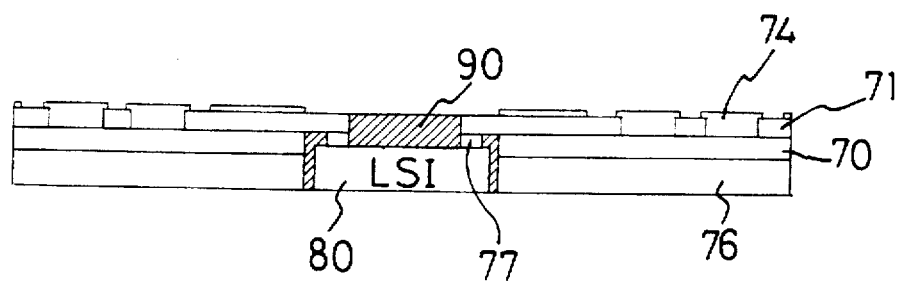
Figure 2J:
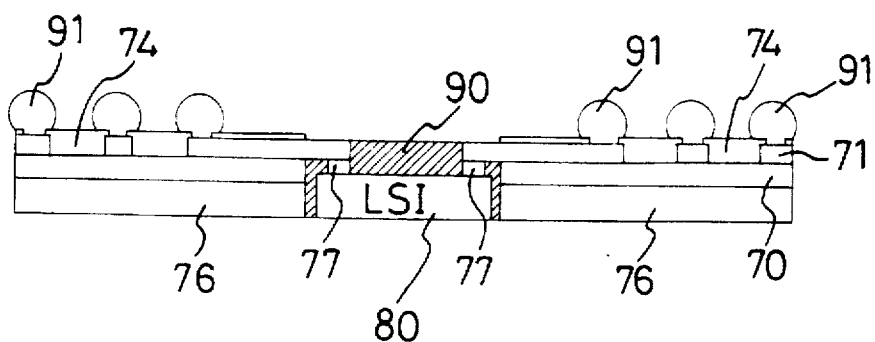

The step as shown in FIG. 1D for laminating an insulator layer 20 and a thin metal layer 30 is more convenient and more accurate than the conventional method which requires an extra procedure to add the reinforcing layer 76 to the product as shown in FIG. 2H. Moreover, the thin metal layer 30 is separated from the deposition layer 12 (i.e., the wiring portion of the semiconductor product) with a very thin insulator layer 20 interconnected therebetween, thus promoting the package electricity effect (for example, the thin metal layer being used as a ground).

It can be concluded that the packaging method in accordance with the present invention includes the following advantages compared to the conventional TAB packaging method:

(1) finer wiring: The wiring portion (i.e., the deposition layer) of the semiconductor product is accurate, stable, and relatively thin, therefore the wiring density is considerably higher than that obtained by the conventional packaging method.

(2) the copper plate formed in the initial step making the subsequent steps of packaging simpler: The copper plate 10 formed in the initial step provides a very strong support for the products in subsequent steps while the conventional method suffers inconvenience of insufficient support due to the soft plate 70.

(3) forming bumps in a very easy manner: This invention utilizes a deposition procedure to form bumps in a more convenient manner than the conventional method using the traditional sputtering procedure to form the metal contacts.

(4) eliminating the need of extra reinforcing plate: The product made by the conventional method requires an extra reinforcing plate 76 (see FIG. 2H) as a support for the whole product while the product made by the method of the present invention has laminated a layer constituted by a thin metal layer and an insulator layer which provide strong support for the product, thus releasing the need of an extra reinforcing plate, making the method more convenient.

(5) better packaging electrical property: The packaging product of the present invention can provide good electricity effect since the thin metal layer 30 is quite near the wiring portion 12, and it has good effect on signal isolation due to the insulator layer 20 interconnected between the thin metal layer 30 and the wiring 12.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as fall within the scope of the appended claims.

I claim:

1. A solid tape automated bonding method comprising:

applying a pattern of a first dry film on a first portion of a copper plate, thereafter, depositing a pattern of a first metal layer on a second portion of the copper plate as wiring;

applying a second dry film on the first dry film and the deposited metal layer and selectively defining bond pad areas in the second dry film in order to expose portions of the wiring;

depositing a second metal as bumps onto the exposed portions of the wiring via the bump pad areas;

removing the first dry film and the second dry film thus exposing the wiring and the bumps;

selectively laminating an insulator layer onto portions of the exposed copper plate and the wiring;

laminating a metal layer on the insulator layer;

applying glue on the metal layer, the bumps, and respective exposed portions of the wiring and the copper plate;

etching the copper plate thus exposing one side of the wiring as ball pads and exposing one side of the insulator layer;

coating solder resist green paint on the exposed side of the insulator layer;

removing the glue;

attaching a die against the bumps;

applying mold compound onto the die so as to fix the die in place; and attaching solder balls onto the ball pads.

2. A solid tape automated bonding method as claimed in claim 1, wherein the first metal layer comprises nickel and copper.

3. A solid tape automated bonding method as claimed in claim 1, wherein the second metal comprises nickel and gold.

4. A solid tape automated bonding method as claimed in claim 1, wherein the insulator layer is made of resin material.

5. A solid tape automated bonding method as claimed in claim 1, wherein the metal layer laminated on the insulator layer has a thickness of 0.5 mm.

6. A solid tape automated bonding method as claimed in claim 1, wherein the insulator layer selectively laminated onto portions of the exposed copper plate and the wiring results in a concave portion substantially at a central portion of the copper plate.

7. A solid tape automated bonding method as claimed in claim 1, wherein the solder resist is made by developer.

* * * * *